(12) United States Patent  
Mehr

(10) Patent No.: US 7,577,414 B2  
(45) Date of Patent: Aug. 18, 2009

(54) METHODS AND APPARATUS FOR AUTOMATIC GAIN CONTROL IN BROADBAND TUNERS

(75) Inventor: Iuri Mehr, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 755 days.

(21) Appl. No.: 11/044,710

(22) Filed: Jan. 27, 2005

(65) Prior Publication Data

US 2006/0166633 A1  Jul. 27, 2006

(51) Int. Cl.  
*H04B 1/06* (2006.01)

(52) U.S. Cl. .................. 455/234.1; 455/250.1

(58) Field of Classification Search .............. 455/226.1, 455/226.2, 226.4, 232.1, 234.1, 234.2, 245.1, 455/250.1, 254; 375/345  
See application file for complete search history.

(56) References Cited

U.S. PATENT DOCUMENTS

| 4,827,511 | A | 5/1989 | Masuko |
| 5,077,541 | A | 12/1991 | Gilbert |
| 5,737,035 | A | 4/1998 | Rotzoll |
| 5,852,772 | A * | 12/1998 | Lampe et al. ............ 455/234.1 |
| 6,016,170 | A | 1/2000 | Takayama et al. |
| 6,100,761 | A | 8/2000 | Ezell |
| 6,177,964 | B1 | 1/2001 | Birleson et al. |
| 6,373,907 | B1 * | 4/2002 | Katsura et al. .............. 375/345 |
| 6,377,315 | B1 | 4/2002 | Carr et al. |
| 6,400,416 | B1 | 6/2002 | Tomasz |
| 6,532,358 | B1 * | 3/2003 | Earls et al. ............... 455/234.1 |

* cited by examiner

*Primary Examiner*—Thanh C Le  
(74) *Attorney, Agent, or Firm*—Wolf, Greenfield & Sacks, P.C.

(57) ABSTRACT

In one aspect, an automatic gain control (AGC) for applying a variable gain to a broadband signal is provided. The AGC comprises a variable gain amplifier adapted to receive the broadband signal as an input, the variable gain amplifier configured to apply a variable gain to the broadband signal based on a value of a gain signal to provide an amplified broadband signal, and a controller to provide the gain signal to the variable gain amplifier, the controller adapted to determine the value of the gain signal based on at least one characteristic of the amplified broadband signal. In a further aspect, the one or more characteristic is a power characteristic of the broadband signal that facilitates control of the broadband signal within a desired power range.

12 Claims, 7 Drawing Sheets

METHODS AND APPARATUS FOR AUTOMATIC GAIN CONTROL IN BROADBAND TUNERS

FIELD OF THE INVENTION

The present invention relates to tuners, and more particularly, to automatic gain control in a pre-amplification phase of a television tuner.

BACKGROUND OF THE INVENTION

Information signals, and in particular television signals, are often transmitted either via a cable connected to a set-top box, or via terrestrial broadcast received by an antenna or satellite dish. In each case, the signals are typically formed of a number of distinct information components transmitted in designated frequency channels. The multi-channel signal is referred to as a broadband signal. Information in the broadband signal may be processed by a tuner to, inter-alia, extract one or more desired channels from the broadband signal. For example, the broadband signal may include signals across the television signal spectrum including the very high frequency (VHF) band (i.e., television carrier frequencies of 54-216 MHz) and the ultra high frequency (UHF) band (i.e., television carrier frequencies of 470-890 MHz). The broadband signal may also include other channel frequencies outside these frequency bands (e.g., cable broadband signals may include, in addition to the VHF and UHF bands, other designated signal carrier frequency bands).

In general, the various frequency bands comprise a number of different channels. For example, the VHF band is divided into 12 channels (channels 2-13) and the UHF band is divided into 70 channels (channel 14-83). Each channel is allocated a certain bandwidth in the broadband spectrum depending on the standard by which the broadband signal is transmitted. For example, the US standard allocates a 6 MHz bandwidth for each channel and specifies where in that channel video and audio information components of the signal should be modulated for transmission. A tuner allows a user to select any one of the channels in the broadband signal to be isolated from the signal and provided, for example, to a television set for viewing.

A tuner may include a pre-amplifier to control the gain of the broadband signal provided to the various processing components of the tuner. For example, an automatic gain control (AGC) may be arranged at the front-end of the tuner to provide an adjustable gain to the broadband signal in an effort to maintain the signal provided by the pre-amplifier at substantially constant level. In particular, the AGC operates to keep the signal power within a dynamic range acceptable to downstream components of the tuner and to maximize signal strength while maintaining a low level of signal distortion.

SUMMARY OF THE INVENTION

One embodiment according to the present invention includes an automatic gain control (AGC) for applying a variable gain to a broadband signal, the AGC comprising a variable gain amplifier adapted to receive the broadband signal as an input, the variable gain amplifier configured to apply a variable gain to the broadband signal based on a value of a gain signal to provide an amplified broadband signal, and a controller to provide the gain signal to the variable gain amplifier, the controller adapted to determine the value of the gain signal based on at least one characteristic of the amplified broadband signal.

Another embodiment according to the present invention includes a method of controlling a gain applied to a broadband signal received by a tuner, the method comprising acts of receiving, as an input, the broadband signal, applying a first gain to the broadband signal to provide an amplified broadband signal, detecting at least one characteristic of the amplified broadband signal, and determining a second gain to be applied to the broadband signal based, at least in part, on the at least one characteristic.

Another embodiment according to the present invention includes a tuner for selecting a desired channel from a broadband signal having a plurality of channels, the tuner comprising a pre-amplifier coupled to receive, as an input, the broadband signal, the pre-amplifier adapted to apply a variable gain to the broadband signal to provide an amplified broadband signal, wherein the pre-amplifier determines values of the variable gain based on at least one characteristic of the amplified broadband signal, and at least one circuit coupled to received the amplified broadband signal as an input and adapted to select the desired channel by substantially removing other channels in the amplified broadband signal to provide a single channel signal.

DETAILED DESCRIPTION

As discussed above, a television tuner is a device that receives a television signal from a cable or terrestrial broadcast source and outputs a channel of interest, substantially rejecting all other channels. For example, the television tuner may receive a broadband signal having a plurality of channels transmitted in respective frequency bands and isolate one of those channels to be demodulated and processed for viewing according to a user's channel selection. The details of how the information is arranged and modulated within the designated frequency band, and the designation and composition of the frequency band itself may depend on geographical location. For example, television signals broadcast in Japan adhere to a different standard than television signals broadcast in the United States. In addition, information may be digitally modulated, analog modulated, or both. However, many general concepts relating to isolating a desired channel from a broadband signal are independent of the broadcast standard used in any particular geographical location.

Figure 1:
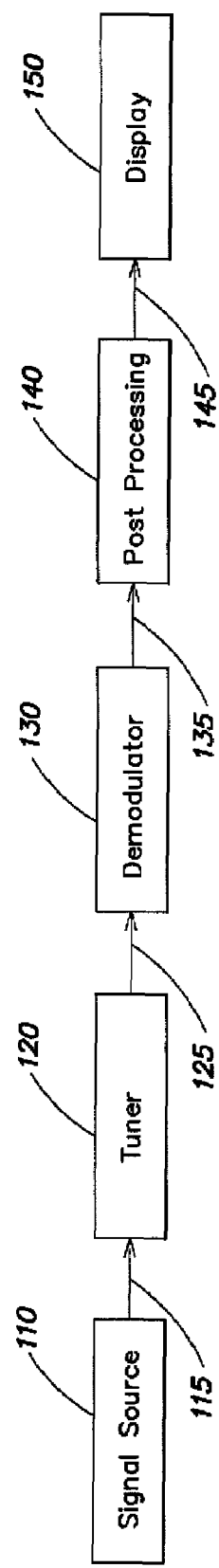
FIG. 1 illustrates a tuner in the context of a conventional television reception apparatus.

FIG. 1 illustrates a tuner in the context of a conventional television reception apparatus. Signal source 110 provides a broadband signal 115 to tuner 120. Signal source 110 may be, for example, a cable connected to a set-top box or terrestrial broadcast source received via an antenna, and may provide either a digitally modulated or analog modulated signal 115. Broadband signal 115 may be comprised of a plurality of channels, each channel occupying some designated bandwidth within the spectrum of the broadband signal. For example, broadband signal 115 may be composed of numerous television channels, only one of which may be of interest at any given moment in time. As discussed above, the designated bandwidth and the composition of the information within each channel typically depends on the broadcast standard under which the signal is transmitted.

Tuner 120 may be a user adjustable component capable of being set to select a desired channel from the broadband signal and substantially reject each of the other channels present in the broadband signal. A resulting signal 125 output by tuner 120 is comprised substantially of a single desired channel selected from the broadband signal 115. Next, demodulator 130 receives the single channel signal 125 and demodulates the information in the signal from the carrier. Demodulator 130 may be one or any combination of demodulators. For example, demodulator 130 may include a demodulator adapted to demodulate signals modulated according to one or more digital modulation techniques, one or more analog modulation techniques, or both. A resulting demodulated signal 135 output by demodulator 130 may then be provided to post processing 140.

Post processing 140 may include any of numerous processing components implementing techniques that may depend on the type and content of signal 135. For example, for digital signals, post processing 140 may include an MPEG decoder to decompress signal 135. Post processing 140 may include any number of and/or combination of filtering, video and audio processing, etc., deemed necessary to prepare the signal for display. Finally, signal 145 provided by post processing 140 is displayed for viewing. For example, display 150 may be a plasma display, liquid crystal display, digital light projection display, a cathode ray tube display, or any other type of display capable of presenting the signal for viewing.

Figure 2:
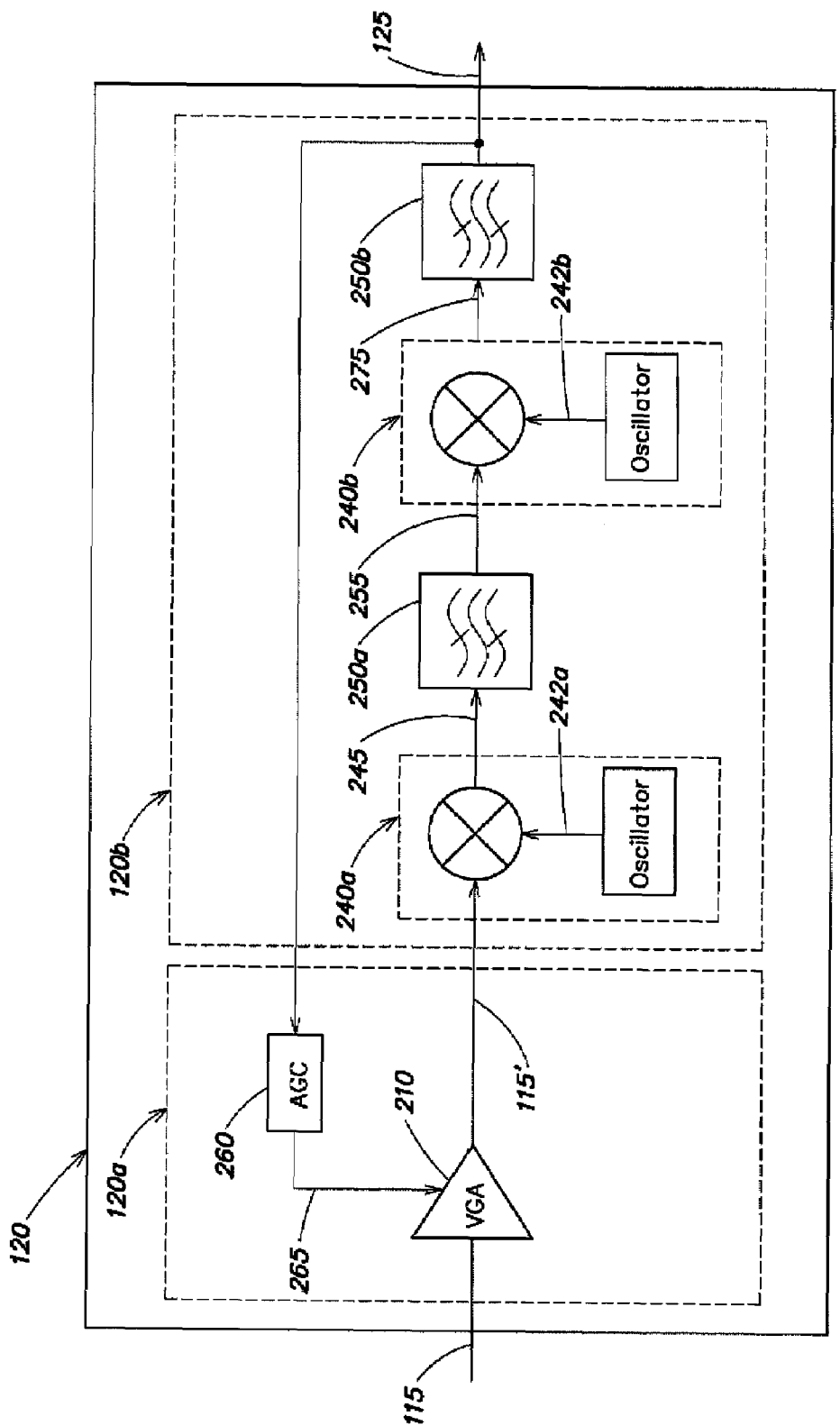
FIG. 2 illustrates a more detailed view of the tuner illustrated in FIG. 1.

FIG. 2 illustrates a more detailed view of tuner 120 illustrated in FIG. 1. Tuner 120 may be comprised of a pre-amplifier stage 120a including a variable gain amplifier (VGA) 210, an automatic gain control (AGC) 260, and dual conversion mixing stage 120b including a first mixer/oscillator pair 240a, bandpass filter 250a, and a second mixer/oscillator pair 240b. Broadband signal 115 is received from a cable or terrestrial broadcast source and amplified by VGA 210 according to the VGA gain as adjustably controlled by gain signal 265. The value of gain signal 265 is determined by AGC 260 as described in further detail below.

VGA 210 provides amplified broadband signal 115' to mixer/oscillator pair 240a. The mixer heterodynes pre-amplified signal 115' with a signal 242a provided by a local oscillator operating at a selected frequency. The mixer/oscillator pair 240a up-converts the amplified broadband signal 115' such that the frequency content of the resulting signal 245 has been shifted in frequency according to the local oscillator frequency. Signal 245 is then provided to bandpass filter 250a having a predetermined pass band that allows signals in a desired frequency range to pass, while substantially rejecting all other frequencies. For example, bandpass filter 250a may have a pass band suitable for passing substantially a single channel of the broadband signal (e.g., bandpass filter 150 may have a pass band substantially equal to 6 MHz). Alternately, bandpass filter 250a may have a pass band that permits more than one channel to pass, for example, by narrowing the broadband signal to two or more channels.

Bandpass filter 250a provides signal 255 to a second mixer/oscillator pair 240b. Mixer/oscillator pair 240b converts frequencies of signal 255 according to the frequency of signal 242b provided by the local oscillator. The second mixer/oscillator pair typically down-converts the frequencies such that the selected channel is centered around the baseband frequency of the tuner. For example, the selected channel in signal 275 may be centered around 44 MHz in US based television tuners. Signal 275 may be further filtered depending on whether bandpass filter 250a is arranged to pass a single or multiple channels from the broadband signal. For example, signal 275 provided by the second mixer/oscillator pair 240b may be provided to bandpass filter 250b to further reject channels proximate the selected channel. Ultimately, signal 125 provided by dual conversion mixing stage 120b includes, essentially, only the selected channel from the broadband signal centered about the baseband frequency of the television receiving apparatus.

It should be appreciated that the front-end of a tuner adapted to isolate a selected channel may include numerous other components, or may select a desired channel in other ways. For example, single conversion methods may be implemented instead of the dual conversion type front-end illustrated in FIG. 2. Other tuners adapted to receive and process different types of television signals such as those described in U.S. patent application Ser. No. 10/850,007 ('007), by Mehr, which is herein incorporated by reference in its entirety, may be suitable for use with the aspects of the present invention.

Broadband signal 115 may be received at pre-amplifier 120a in a wide variety of conditions that may depend on such factors as the type of signal being transmitted, the type of transmission media, the modulation technique and/or the geographical location of the tuner itself. For example, broadband signal 115 may be transmitted via a cable to tuner 120, or alternatively, broadband signal 115 may be broadcast from a terrestrial source via wireless electromagnetic radiation and provided to tuner 120 from an antenna, satellite dish, or the like. When transmitted via a cable, broadband signal 115 may have relatively low noise and high signal strength as compared to broadband signals received from a terrestrial broadcast source, e.g., a base station. In addition, a tuner located in an area obstructed from the broadcast source may receive a signal 115 of relatively low signal power and high noise as compared to a tuner 120 located near or in a substantially unobstructed relationship with the broadcast source.

To assist in processing signals having variable quality attributes (e.g., varying noise and signal strength characteristics), tuner 120 comprises VGA 210 which receives variable gain signal 265 from AGC 260 indicative of a level of gain to be applied to broadband signal 115. A purpose of pre-amplification stage 120a is to ensure that the broadband signal received by the front-end components of the tuner (e.g., the dual conversion mixing stage 120b and/or other downstream stages of the television reception apparatus) is provided with an adequately high signal to noise ratio (SNR) and sufficiently low distortion and within a relatively limited dynamic range. For example, the television tuner may receive an input signal ranging from approximately −85 dBm to 5 dBm. Without pre-amplification, downstream processing blocks of the tuner would be required to handle this relatively large dynamic range. The pre-amplifier stage may be employed to reduce the dynamic range requirements of the tuner by maintaining the signal level within a reduced range.

In tuner 120, the AGC loop operates by examining various properties of the baseband signal 125. That is, AGC 260 controls the gain of VGA 210 based on one or more properties of the single channel selected by the tuner. For example, AGC 260 may receive the baseband signal to detect one or more power characteristics of the signal. Applicant has identified and appreciated that detecting characteristics of the baseband signal (or other substantially single channel signals at other frequencies) has the generally undesirable effect of de-sensitizing the tuner. In particular, signal characteristics existing largely in channels other than the selected channel may be invisible to the detecting mechanisms of the AGC loop. For example, interferers in other channels of the broadband signal will not be detectable in the baseband signal, since they are significantly attenuated by front end filtering techniques (e.g., by filters 250*a* and 250*b*). However, these interferers may cause significant distortion in front-end components of the tuner. Even though generally undesirable conditions such as interferers may not be substantially present and/or detectable in the baseband signal, components that operate on the broadband signal suffer distortion that ultimately affects the integrity of the baseband signal. Accordingly, because conventional AGC loops are effectively blind to certain broadband signal conditions, the loop cannot vary the VGA gain to compensate before the selected channel is adversely affected.

Applicant has appreciated that by pulling back the detecting mechanisms of the AGC loop to the broadband signal, various characteristics of the signal that adversely effect tuner performance, such as interferers, may be detected and appropriately addressed. In addition, since the AGC loop operates on the signal being provided by the components being controlled by the loop (i.e., the broadband signal provided by the VGA), it may be simpler to achieve a stable control loop that maintains a relatively constant signal level for the front-end components of the tuner, regardless of the nature of the signal that is received from the broadcast station or cable and responsive to a wider range of adverse signal conditions.

Figure 3:
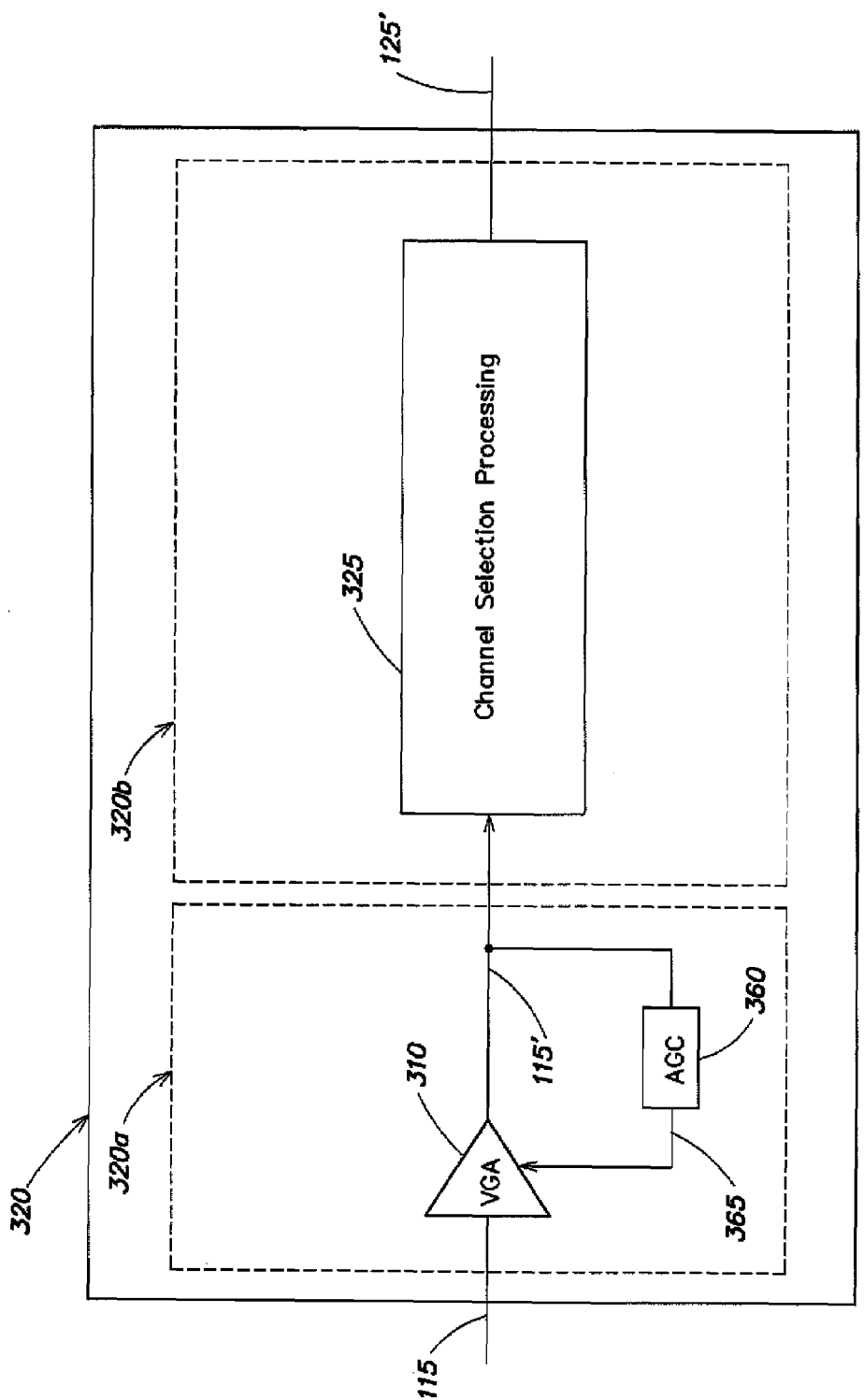
FIG. 3 illustrates a tuner having a pre-amplifier that operates on one or more characteristics of a broadband signal, in accordance with one embodiment of the present invention.

FIG. 3 illustrates an automatic gain controller in the context of a pre-amplification stage of a tuner, in accordance with one embodiment of the present invention. Tuner 320 includes a pre-amplification stage 320*a* and a front-end channel selection stage 320*b*. Channel selection stage 320*b* is illustrated generically as comprising channel selection processing 325. For example, channel selection processing 325 may include the dual conversion stage illustrated in FIG. 2, or may include any of the circuits and components illustrated in the '007 application, or any other variety and arrangement of components adapted to select a desired channel from a broadband signal.

Pre-amplification stage 320*a* includes a variable gain amplifier 310 and AGC 360. As in AGC 260 illustrated in FIG. 2, AGC 360 controls the gain level on VGA 310 (via gain signal 365) to provide an appropriate amplification to broadband signal 115. The resulting amplified broadband signal 115' is then provided to channel processing 325. However, rather than forming the AGC control loop by analyzing properties of the baseband signal (i.e., signal 125') as in conventional pre-amplifiers, AGC 360 generates gain control signal 365 based on properties of broadband signal 115'. By detecting one or more properties of broadband signal 115', certain adverse conditions invisible to conventional AGC loops may be detected and subsequently compensated for to, amongst other things, preserve the integrity of the information in the selected channel.

In FIG. 3, AGC 360 receives the amplified broadband signal 115' directly from variable gain amplifier 310. However, the aspects of the invention are not limited in this respect. Some filtering or other processing may occur after amplification and before the AGC taps off the broadband signal. For example, the broadband signal may be low pass filtered to remove very high frequency noise outside the broadband spectrum before or after amplification, thus leaving the broadband signal substantially intact. Alternatively, one or more channels within the broadband signal may be rejected without removing significant information or a substantial number of channels from the broadband signal. It may be preferable to analyze the broadband signal immediately after amplification to ensure that signal properties in any band that may deteriorate tuner performance are detected before front-end processing filters out the offending frequencies. However, immediate detection after amplification is not a requirement of or a limitation on the aspects of the invention.

Figure 4:
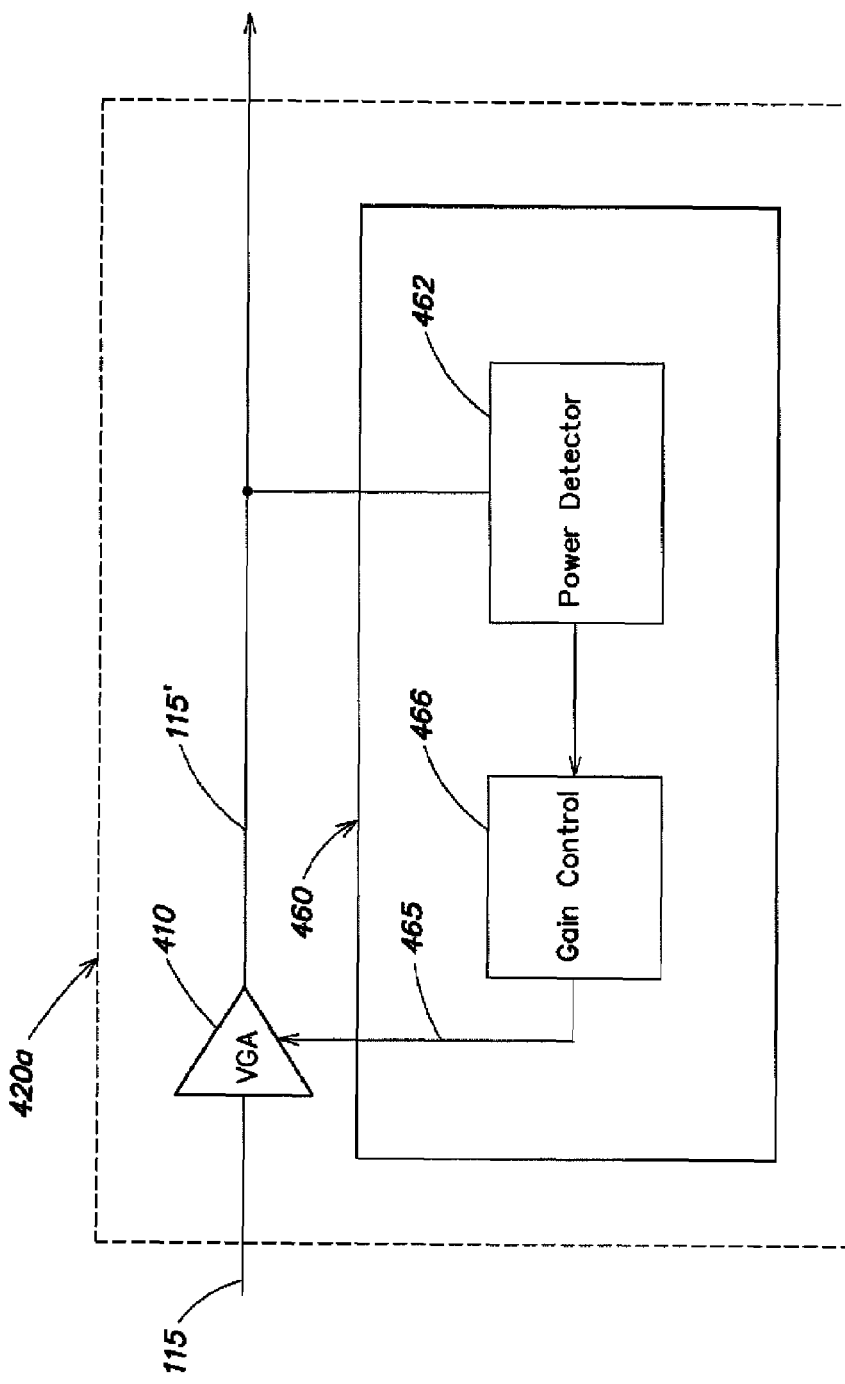
FIG. 4 illustrates a pre-amplifier having an automatic gain controller (AGC) that operates on one or more power characteristics of a broadband signal to determine values of a variable gain, in accordance with one embodiment of the present invention.

FIG. 4 illustrates a pre-amplifier stage having an automatic gain control that operates on one or more power characteristics of a broadband signal to determine a gain signal to control the gain of a VGA component, in accordance with one embodiment of the present invention. Pre-amplifier stage 420*a* may provide an amplified broadband signal 115' to the front-end channel selector of a television tuner. The AGC loop, comprising VGA 310, power detector 462, and gain control 466, operates on one more power characteristics of amplified broadband signal 115' provided by the VGA to achieve as constant a signal level for the broadband signal as possible in the face of a fluctuating input broadband signal. In particular, power detector 462 taps off amplified broadband signal 115' and provides one or more power characteristics of the signal to gain control 466. The term "power characteristic" refers to any value, property or attribute of a signal indicative of the power level of the signal. For example, a power characteristic may be a direct power measurement such as the root mean square (RMS) value of the signal or may be statistically related to the power such as the envelope of the signal. Other power characteristics include, but are not limited to peak value, peak-to-envelope ratio (PER), peak-to-average ratio (PAR), etc.

Gain control 466 employs the one or more power characteristics obtained from broadband signal 115' to facilitate determining a gain signal to control the VGA such that the appropriate gain is applied to broadband signal 115. For example, based on the current detected value of the one or more obtained power characteristics, gain control may determine a gain signal that attempts to maintain amplified broadband signal 115' at a desired level or within a tolerated range. Any of various control mechanisms may be used to form the control loop, including, but not limited to traditional control methods such as proportional control, integral control, proportional-integral (PI) control, derivative control, proportional-derivation (PD) control, integral-derivation (ID) control, proportional-integral-derivative (PID) control, etc. as the aspects of the invention are not limited in this respect. In this way, an AGC loop may be implemented based on power characteristics of the broadband signal, rather than characteristics of signals further downstream, such as the baseband signal. As discussed above, detecting properties of the broadband signal permits a wider range of detrimental signal conditions to be compensated for by the AGC loop, as described in further detail below.

Figure 5:
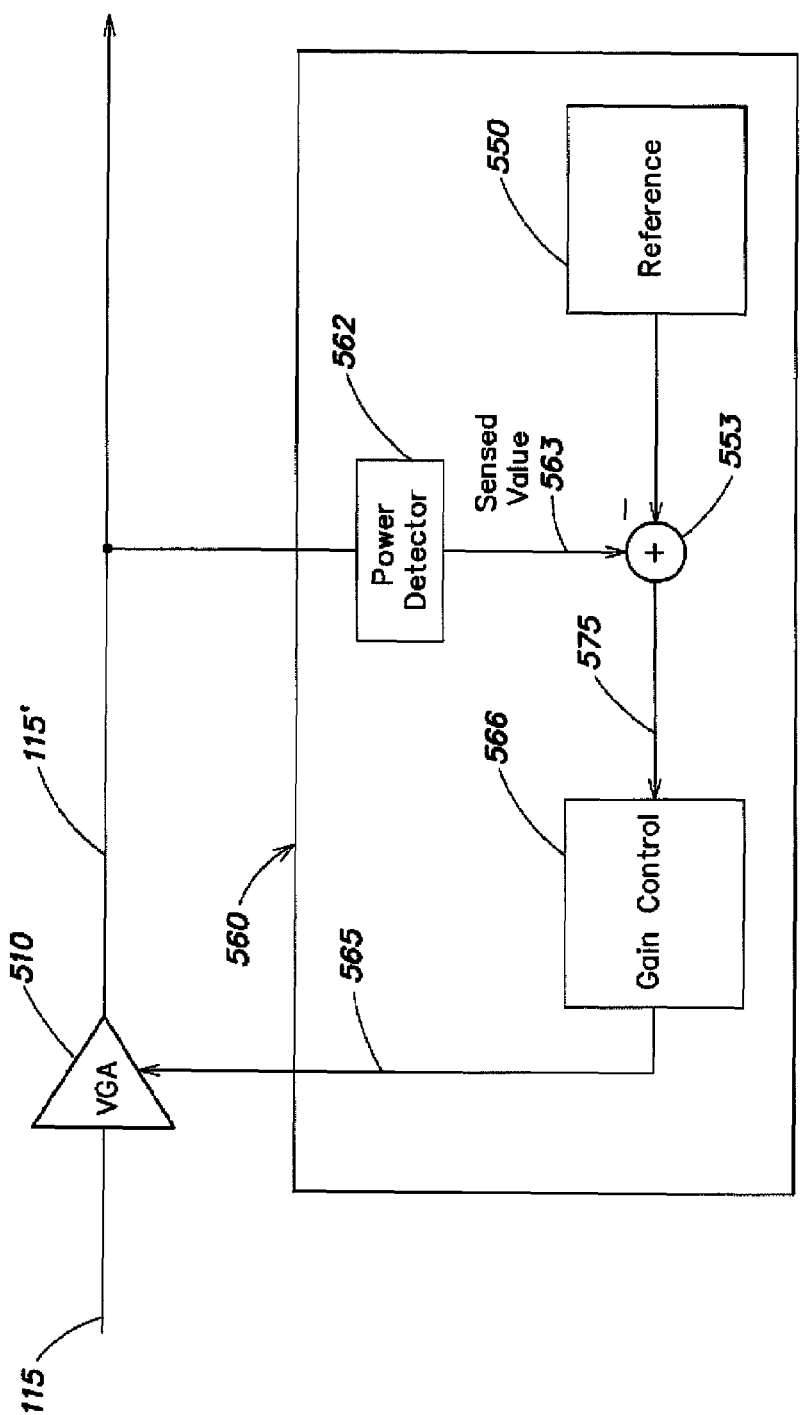
FIG. 5 illustrates a pre-amplifier having an AGC that operates by comparing one or more sensed power characteristics of a broadband signal with a reference to determine values of a variable gain, in accordance with one embodiment of the present invention.

FIG. 5 illustrates another embodiment of an AGC component operating on one or more power characteristics of a broadband signal, according to the present invention. AGC 560 operates by comparing a sensed value 563 related to the power level of the broadband signal to a generally desirable reference 550 to generate an error signal. The error signal operates as a measure of how far detected power characteristics of the broadband signal deviate from desired values. The AGC loop is configured to drive the error signal to zero to maintain power characteristics of the broadband signal at a level indicated by the reference value. Power detector 562 is coupled to amplified broadband signal 115' and is adapted to determine at least one power characteristic of the broadband signal. As discussed in connection with FIG. 4, power detector 562 may determine the envelope of the broadband signal, the RMS value, the peak value or any other characteristic indicative of the power level of the broadband signal that may be used to maintain the broadband signal in a desirable range. Power detector 562 provides sensed value 563 indicating the current value of the one or more power characteristics.

A reference value 550 corresponding to a desired level for the sensed power characteristic(s) is provided to compute the deviation of the actual signal. In particular, reference value 550 is provided to summing element 553 to be subtracted from the sensed value 563 to generate an error signal 575 indicative of the difference between the actual and desired power characteristic of the broadband signal. Reference 550 may be chosen in any number of ways such as by employing empirical or statistical information of the broadband signal. Reference signal 550 may also be programmable so that its value may be modified or adjusted as needed. In addition, reference signal 550 may be automatically adjusted by the AGC loop based on one or more characteristics of the broadband signal, tuner characteristics, etc., as described in further detail below.

Gain control 566 receives error signal 575 and adjusts the gain of the VGA based on the magnitude of the error signal. In particular, gain control 566 processes error signal 575 to generate a gain signal 565 that varies the gain of VGA 310 to cause a reduction in the magnitude of error signal 575. In general, the assumption is that when the sensed value and the reference value are substantially the same, the broadband signal provided by the amplifier is within a tolerated range. That is, the broadband signal is maintained with a dynamic range expected by the front-end and other downstream components and has an acceptable signal-to-noise ratio (SNR) and distortion characteristics.

Figure 6:
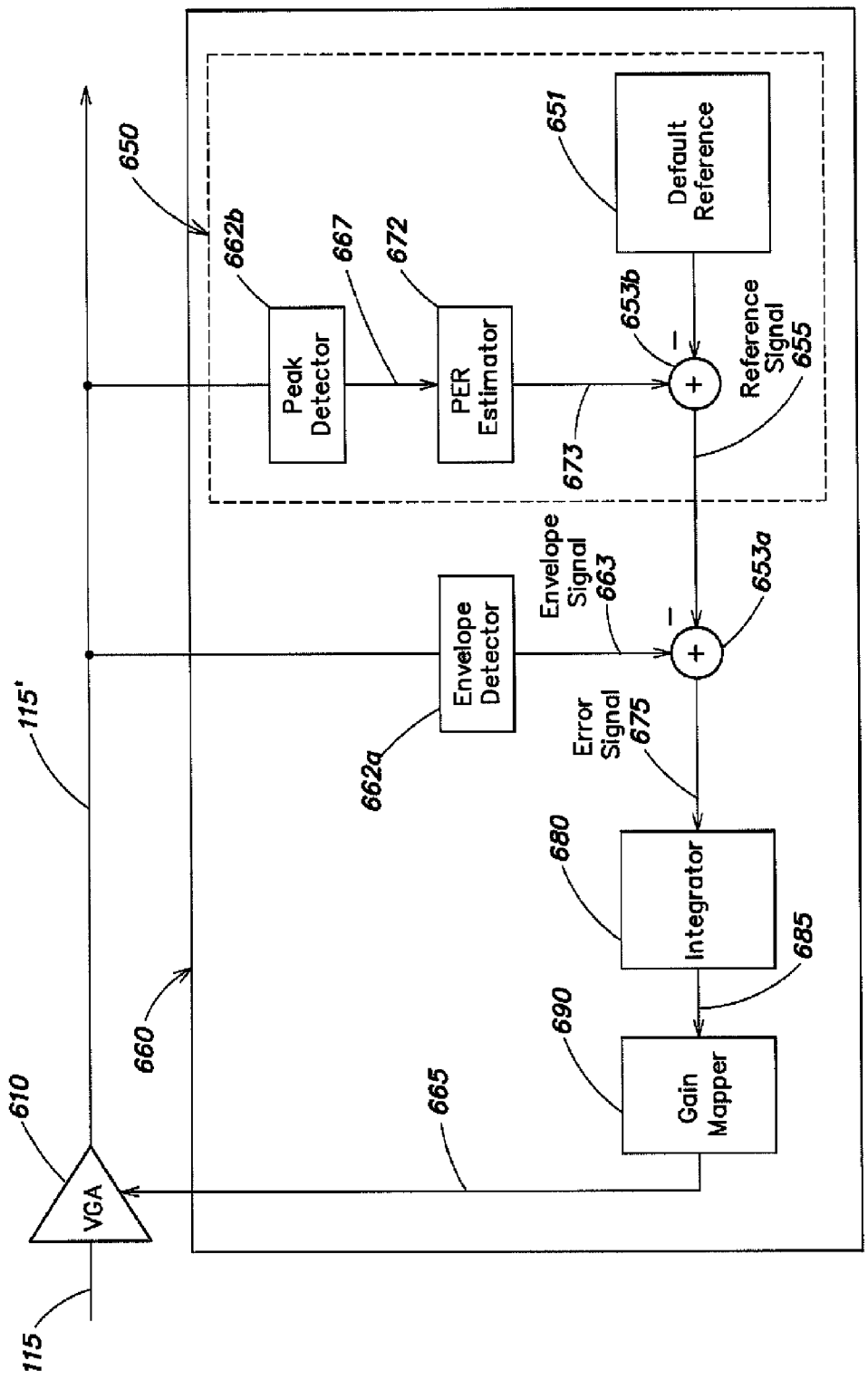
FIG. 6 illustrates a pre-amplifier having an AGC that operates on envelope and peak values of the broadband signal to determine values of a variable gain, in accordance with one embodiment of the present invention.

FIG. 6 illustrates a pre-amplifier stage employing a plurality of power characteristics of a broadband signal in an AGC loop, in accordance with another embodiment of the present invention. AGC 660 provides a gain signal 665 to control a gain of a VGA 610 based on envelope and peak values of an amplified broadband signal. In particular, AGC 660 includes an envelope detector 662a coupled to the broadband signal to generate envelope signal 663 indicative of the envelope of the broadband signal. Suitable envelope detectors are known in the art and will not be described in detail herein. Envelope signal 663 may be generated, in part, by computing the average value of broadband signal 115'. In one embodiment, AGC 660 operates on a clock (e.g., an 8 MHz clock) and signal 115' is provided to an envelope detector to provide values $S_{env}$. The absolute value of $S_{env}$ may then be averaged over a predetermined interval. In one embodiment, envelope signal 663 is computed as a log-amp signal using, for example, the following formulation:

$$V_{env} = V_{ref} - V_x \log_{10}\left(\frac{|S_{env}|}{S_0}\right) \quad (1)$$

Where $V_{env}$ is envelope signal 663, $V_{ref}$ is a reference voltage (e.g., 2V), $V_x$ is the slope of the transfer function of envelope detector 662a (e.g., 20 mV/dB), $S_0$ is the intercept point of the detector (approximately 200 μV), and $S_{env}$ is computed as described above. It should be appreciated that envelope signal 663 may be computed in any number of ways in either analog or digital form, as the aspects of the invention are not limited in this respect. Envelope signal 663 provides an indication of the power of the broadband signal. $V_{env}$ operates as the sensed power characteristic of the AGC loop. For example, $V_{env}$ may be used as the sensed value 563 in AGC 500 illustrated in FIG. 5. It should be appreciated that envelope signal 663 may be replaced with or supplemented by other power characteristics such as RMS power, etc.

In addition, AGC 660 includes a reference block 650 configured to provide reference signal 655 to be subtracted from envelope signal 663 at summing element 653. Reference block 650 includes a default reference value 651 indicating a generally desirable value against which to measure the sensed property (e.g., envelope signal 663). For example, the default reference 651 may be a peak value estimate based on the statistical mean of 134 random phase sinusoidal carriers (i.e., a peak-to-envelope ratio of 12.5 dB). It should be appreciated that the default reference may be chosen in other ways, such as by empirical measurement, and may be any value deemed appropriate as an initial estimate from which to evaluate the sensed power characteristic(s) in the control loop, as described in further detail below.

Reference block 650 also includes an additional sensed property of the broadband signal that may be employed to adjust or correct default reference 661. In particular, reference block 650 includes a peak detector 662b coupled to the broadband to sense peak values 667 of the signal. PER estimator 672 receives the peak information from the peak detector and determines an adjustment to the default reference 661. In one embodiment, PER estimator 672 determines an adjustment to the reference based on the number peaks that deviate from a threshold value. For example, PER estimator may count the number of peaks having a value above and below a respective threshold value. The threshold value may be different or the same with respect to the count. That is, PER estimator may count the number of peaks above a first threshold and count the number of peaks below a second threshold, disregarding peaks falling in between. Alternatively, a single threshold value may be used wherein peaks falling above and below are counted, respectively.

If the number of peaks exceeding the threshold is substantially the same as the number of peaks below the threshold in a given interval, the default reference value is assumed to be suitable and no adjustment is made. Otherwise, if the number of peaks above the threshold is significantly greater than the number of peaks below the threshold in a given interval, the default reference may be considered an inadequate estimate and an adjustment 673 is made to the default reference. Likewise, if the number of peaks below the threshold greatly exceeds the number of peaks over the threshold, PER estimator provides an appropriate adjustment 673 to the reference value. The magnitude of the adjustment may depend on how significantly the two peak counts differ. The default reference may be adjusted according to the adjustment signal 673 by summing element 653b to provide reference signal 655, which may then be compared with envelope signal 663 to provide error signal 675.

The PER estimator facilitates, inter-alia, handling of situations wherein so-called slow interferers are present in the signal that may not be adequately addressed by the envelope. The term "slow interferer" refers generally to interference having a relatively low frequency. For example, interference in the approximately Hz-kHz range is typically considered a slow interferer (e.g., interference caused by passing cars or the operation of an electrical device drawing 60 Hz power from the wall, etc.).

A preponderance of relatively large peaks in a broadband signal over a particular interval may indicate the presence of a slow interferer. However, this condition may cause no appreciable change in the computed envelope since the computation value may include taking an average over the interval. If the AGC loop was controlled solely according to fluctuations in the envelope values, the loop may not react fast enough, if at all, to slow interferers (and/or to fast interferers as discussed in further detail below) and the tuner would be vulnerable to the resulting distortion. The peak detector addresses this circumstance and others by identifying slow interferers via the peak count as described above. The PER estimator provides an additional measure that facilitates a more responsive AGC loop to potentially adverse operating conditions of the tuner. In general, the AGC control loop illustrated in FIG. 8 may address signal conditions that would be missed by conventional AGC loops that operate on the baseband signal. For example, interferers in channels other than the selected channel that cause, temporarily, increased error signals and subsequent correction via the gain signal 665 may be entirely missed using conventional baseband techniques.

To complete the AGC loop, error signal 675 may be provided to integrator 680, the result of which may be provided to gain mapper 690 as integrated error signal 685. The gain mapper may then transform the integrated error signal 685 into a value for gain signal 665 that tends to decrease the magnitude of the error. Gain mapper 690, for example, may include one or more look-up tables that transform error values into corresponding gain signals or may include a proportional gain function to appropriately scale the error values or any other mechanism suitable for mapping error values to appropriate gain changes to be applied to VGA 610.

It should be appreciated that the use of broadband envelope and peak values to guide the AGC control loop is merely exemplary. Any one or combination of power characteristics may be used to indicate whether the amplified broadband signal is within an acceptable range. For example, RMS values may be used to indicate broadband power levels. In addition, peak values may be used alone or in combination with other power characteristics in the sensor block as well as the reference block. In general, any number and combination of properties of the broadband signal may be considered in forming an AGC loop to control the gain of the pre-amplifier, as the aspects of the invention are not limited for use with any particular set of broadband properties or limited to address any particular set of broadband signal conditions.

Figure 7:
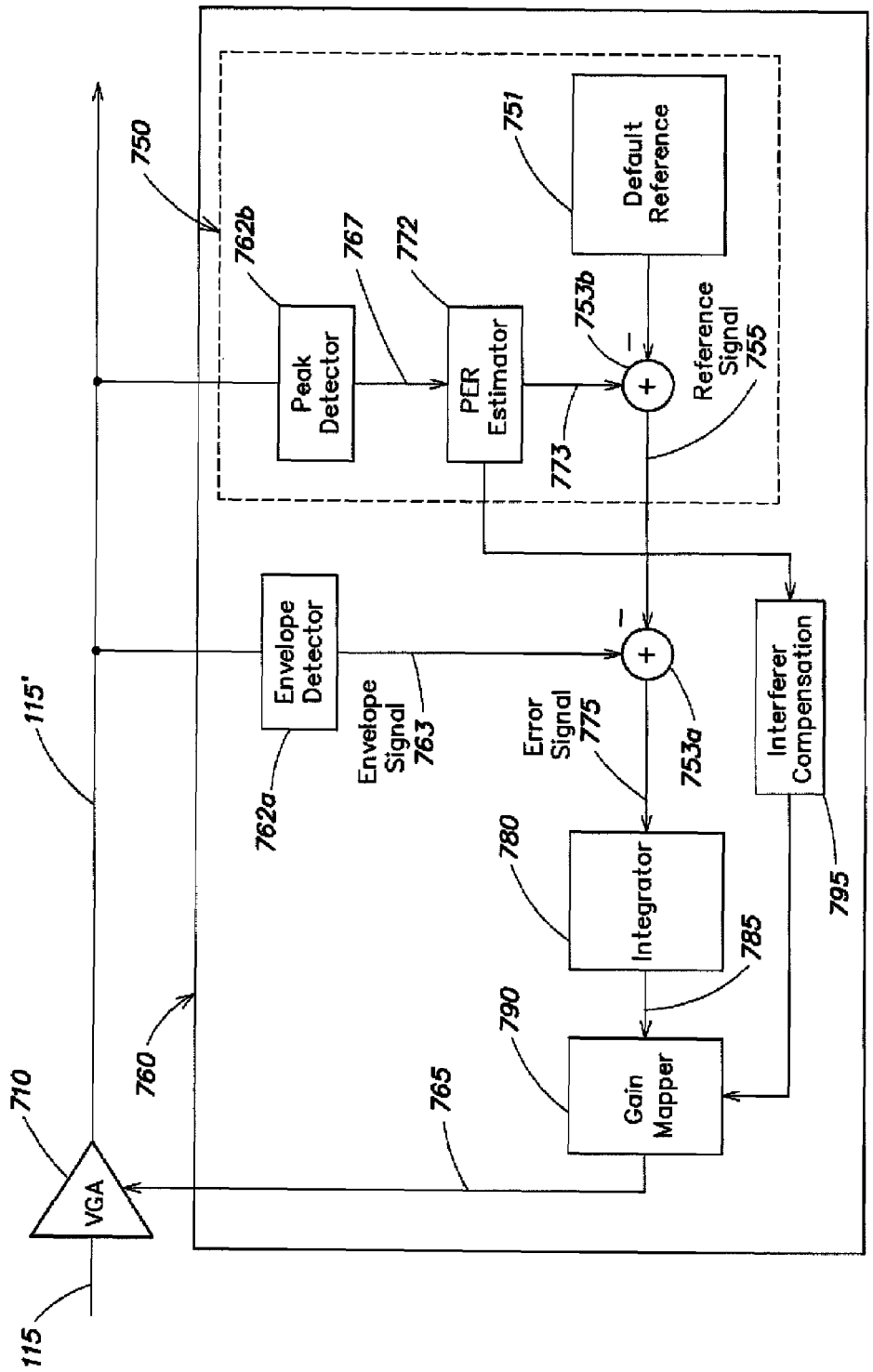
FIG. 7 illustrates a pre-amplifier having an AGC having a variable default reference and fast interferer compensation to determine values of a variable gain, in accordance with one embodiment of the present invention.

FIG. 7 illustrates an AGC loop including a variable reference signal and fast interferer compensation, in accordance with one embodiment of the present invention. The term "fast interferer" refers generally to interference having a relatively high frequency. For example, interference in the approximately 100 kHz and above range is typically considered a fast interferer (e.g., interference caused by AM and FM radio stations, etc.). AGC 760 may be similar to AGC 660 described in connection with FIG. 6. However, AGC 760 includes an additional control path to the gain mapper to compensate for the appearance of fast interferers on the broadband signal.

Fast interferers may manifest themselves as an unusually large number of peaks exceeding a threshold in an observed time interval. Reference block 750 may be similar to reference block 650 described in connection with FIG. 6. However, PER estimator 772 may include, in addition to the peak counts described in FIG. 6, an additional count that accumulates the number of peaks that exceed a threshold. The threshold may be different or the same from the thresholds used in the reference value adjustment method described above. If the number of peaks in a given interval of time (e.g., the observed window of the PER estimator) exceeds a count threshold, it is assumed that a so-called fast interferer is superimposed on the broadband signal.

When PER estimator 772 determines that a fast interferer condition has occurred, interferer compensation 795 may be notified by either by sending a flag or by sending the peak count. Alternatively, PER estimator 772 may continuously send the peak count and the threshold operation may be implemented at interferer compensation 795. In any event, an unusually high number of large peaks in a given time interval causes interferer compensation 795 to indicate to the gain mapper 790 that a fast interferer condition has been detected. In response, gain mapper 790 may generate a gain signal to apply a relatively significant gain change to VGA 710.

Fast interferers are often relatively short-lived transients that happen quickly and when undetected, may cause significant signal distortion. A fast interferer may be compensated for by quickly reducing the gain of the VGA to ensure that the broadband signal level does not exceed an acceptable level where significant distortion occurs. In one embodiment, when a fast interferer is detected, the second control path overrides the first control path (i.e., a gain adjustment from interferer compensation 795 takes precedence over a gain adjustment indicated by error signal 775) to cause a generally more significant gain change than the first control path. When the fast interferer condition ceases, the first control path resumes control of the AGC loop. Not only does this ensure quick and proper response to fast interferers, it avoids possible conditions wherein the two control paths attempt to drive the gain in opposite directions.

AGC 760 also includes a variable reference that can be adjusted depending on various conditions of the tuner or broadband signal. Reference profile 751 permits the AGC to automatically adjust the default reference as a function of at least one variable and, if desired, independent of the adjustment made by the PER estimator. In one embodiment, reference profile 751 provides a mapping between input signal strength and the default reference value. The resulting default reference value may then be adjusted according to the PER estimator based on characteristics of the sensed peak values as described above.

In particular, when both the input broadband signal strength and the gain are relatively high, the gain may need to be reduced by more than what is required by the default reference value to avoid distortion. That is, the first control path may settle to a gain that is too high in view of a relatively strong input broadband signal, resulting in distortion. The input signal strength may be monitored to reduce the default reference value such that the first control path reduces the gain of the VGA. For example, in differential amplifiers, a relatively low value at the inverting input and a relatively high value at the non-inverting output may indicate that the gain is too high. In particular, when a large voltage is seen across the amplifier the distortion will be greater. Accordingly, reference profile 751 may receive, as an input, the signal strength of the input broadband signal as determined by examining the amplifier outputs in view of the known gain. When the signal strength is relatively large, reference profile 751 maps the signal strength to a lower default reference value. Reference profile 751 may be implemented in any number of ways such as a look-up table, a function or any other mapping from input signal strength to default reference value. In addition, other variables may be considered in determining the default reference either alone or in combination with broadband signal strength, as the aspects of the invention are not limited in this respect.

It should be appreciated that the AGC loops may operate as the variable gain path in pre-amplifiers that employ dual gain path, i.e., a fixed gain path and a variable gain path as described in the '007 application. By providing a fixed gain path and a variable gain path, the tradeoff between SNR and distortion may be optimized by switching between the two paths based on properties of the signal being processed.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed function. The one or more controller can be implemented in numerous ways, such as with dedicated hardware, circuitry or with general purpose hardware (e.g., one or more processor) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. An automatic gain control (AGC) for applying a variable gain to a broadband signal, the AGC comprising:

a variable gain amplifier adapted to receive the broadband signal as an input, the variable gain amplifier configured to apply a variable gain to the broadband signal based on a value of a gain signal to provide an amplified broadband signal; and a controller to provide the gain signal to the variable gain amplifier, the controller adapted to determine the value of the gain signal based on at least one power characteristic of the amplified broadband signal, wherein the controller includes at least one first power detector adapted to detect a first power characteristic to generate at least one sensed value and at least one second power detector adapted to detect a second power characteristic having peak values of the broadband signal, wherein the controller includes a default reference that is adjusted based at least on a first number of peak values of the broadband signal exceeding a first threshold during a predetermined time interval to determine the at least one reference value, and wherein the controller includes a comparator configured to provide an error signal indicative of a difference between the at least one sensed value and at the least one reference value.

2. The AGC of claim 1, wherein the at least one first power characteristic includes at least one of elements chosen from a set consisting of root mean square (RMS) values, envelope values, and peak values of the amplified broadband signal.

3. The AGC of claim 1, wherein the first power characteristic is an envelope of the broadband signal.

4. The AGC of claim 1, wherein the controller includes a gain mapper configured to determine the gain signal based on the error signal provided by the comparator.

5. The AGC of claim 4, wherein the controller includes a fast interferer detector coupled to the at least one second power detector, the fast interferer providing a fast interferer signal to the gain mapper when a second number of peak values of the broadband signal exceed a second threshold value during the predetermined time interval to indicate a fast interferer condition.

6. The AGC of 5, wherein the second number is greater than the first number.

7. The AGC of claim 5, wherein the gain mapper is configured such that when the fast interferer detector provides the fast interferer signal, the gain mapper determines the gain signal based on the fast interferer signal instead of the error signal.

8. The AGC of claim 1, wherein the default reference is a constant value.

9. The AGC of claim 1, wherein the default reference is a function of at least one variable.

10. The AGC of claim 9, wherein the default reference is a function of at least one variable of the broadband signal.

11. The AGC of claim 10, wherein the default reference is a function of at least broadband signal strength.

12. The AGC of claim 1, in combination with a television tuner, wherein the amplified broadband signal is provided to front-end components of the television tuner to select a desired channel from the amplified broadband signal.

* * * * *